United States Patent
Lee et al.

(10) Patent No.: US 10,439,589 B2
(45) Date of Patent: Oct. 8, 2019

(54) BULK ACOUSTIC WAVE RESONATOR AND FILTER INCLUDING THE SAME

(71) Applicant: SAMSUNG ELECTRO-MECHANICS CO., LTD., Suwon-si (KR)

(72) Inventors: Tae Kyung Lee, Suwon-si (KR); Jae Sang Lee, Suwon-si (KR); Ran Hee Shin, Suwon-si (KR); In Young Kang, Suwon-si (KR); Sung Sun Kim, Suwon-si (KR); Sung Han, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/452,090

(22) Filed: Mar. 7, 2017

(65) Prior Publication Data

US 2017/0373665 A1 Dec. 28, 2017

(30) Foreign Application Priority Data

Jun. 24, 2016 (KR) .................. 10-2016-0079366
Jan. 26, 2017 (KR) .................. 10-2017-0012948

(51) Int. Cl.
*H03H 9/17* (2006.01)
*H03H 9/54* (2006.01)
*H03H 9/13* (2006.01)
*H03H 9/60* (2006.01)

(52) U.S. Cl.
CPC ............... *H03H 9/17* (2013.01); *H03H 9/13* (2013.01); *H03H 9/173* (2013.01); *H03H 9/54* (2013.01); *H03H 9/60* (2013.01); *H03H 9/605* (2013.01)

(58) Field of Classification Search
CPC ........................................... H03H 9/17
USPC ........................................... 333/187
See application file for complete search history.

(56) References Cited

U.S. PATENT DOCUMENTS

| | | | | |
|---|---|---|---|---|
| 2001/0009222 A1* | 7/2001 | Mizouchi | ............. | C23C 14/185 204/192.17 |
| 2003/0186074 A1* | 10/2003 | Chen | ............. | B32B 15/017 428/651 |
| 2005/0184627 A1* | 8/2005 | Sano | ............. | H01L 41/316 310/363 |
| 2005/0248238 A1 | 11/2005 | Yamada et al. | | |
| 2009/0045704 A1* | 2/2009 | Barber | ............. | H03H 9/131 310/364 |
| 2013/0119495 A1* | 5/2013 | Vetr | ............. | H01L 43/08 257/421 |
| 2015/0280687 A1* | 10/2015 | Burak | ............. | H03H 9/132 310/321 |

(Continued)

FOREIGN PATENT DOCUMENTS

| | | |
|---|---|---|
| JP | 2003-198319 A | 7/2003 |
| JP | 2007-129776 A | 5/2007 |
| JP | 2016-032195 A | 3/2016 |

*Primary Examiner* — Stephen E. Jones
*Assistant Examiner* — Samuel S Outten
(74) *Attorney, Agent, or Firm* — NSIP Law

(57) ABSTRACT

A bulk acoustic wave resonator includes a substrate, a first electrode and a second electrode formed on the substrate, and a piezoelectric layer provided between the first electrode and the second electrode. Either one or both of the first electrode and the second electrode include a molybdenum-tungsten alloy having a weight ratio of molybdenum to tungsten in a range of 3:1 to 1:3.

15 Claims, 10 Drawing Sheets

(56) References Cited

U.S. PATENT DOCUMENTS

2017/0288122 A1* 10/2017 Zou .................... H01L 41/0471

* cited by examiner

BULK ACOUSTIC WAVE RESONATOR AND FILTER INCLUDING THE SAME

CROSS-REFERENCE TO RELATED APPLICATION(S)

This application claims the benefit under 35 USC 119(a) of Korean Patent Applications No. 10-2016-0079366, filed on Jun. 24, 2016 and No. 10-2017-0012948, filed on Jan. 26, 2017 in the Korean Intellectual Property Office, the entire disclosure of which is incorporated herein by reference for all purposes.

BACKGROUND

Field

The present disclosure relates to a bulk acoustic wave resonator and a filter including the same.

Description of Related Art

Recently, in accordance with the rapid development of mobile communications devices, chemical and biological devices, and the like, demand for small and light filters, oscillators, resonant elements, acoustic resonant mass sensors, and the like, used in these devices has also increased.

As a means of implementing such small and light filters, oscillators, resonant elements, acoustic resonant mass sensors, and the like, a film bulk acoustic resonator (hereinafter, referred to as an "FBAR") has been developed. FBAR may be mass-produced at minimum cost and may be implemented at a subminiature size. In addition, the FBAR may be implemented to have a high quality factor (Q) value, which is the main characteristic of a filter. FBAR can be used in personal communications systems (PCS) and digital cordless systems (DCS) that includes microwave frequency bands.

In general, the FBAR includes a resonant portion implemented by sequentially stacking a first electrode, a piezoelectric layer, and a second electrode on a substrate.

An operating principle of the FBAR will be described. First, when electric energy is applied to the first and second electrodes to induce an electric field in the piezoelectric layer, the electric field may generate a piezoelectric phenomenon in the piezoelectric layer to allow the resonant portion to vibrate in a predetermined direction. As a resultant, a bulk acoustic wave is generated in the same direction as the direction in which the resonant portion is vibrating, thereby generating resonance.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a bulk acoustic wave resonator includes a substrate, a first electrode and a second electrode formed on the substrate, and a piezoelectric layer disposed between the first electrode and the second electrode. Either one or both of the first electrode and the second electrode include a molybdenum-tungsten alloy. A weight ratio of molybdenum to tungsten in the molybdenum-tungsten alloy is in a range of 3:1 to 1:3.

The weight ratio between the molybdenum and the tungsten in the molybdenum-tungsten alloy may be in the range of 3:1 to 1:1.

The molybdenum-tungsten alloy may have a (110) crystal face orientation.

The piezoelectric layer may be formed of aluminum nitride.

The piezoelectric layer may include a rare earth metal or transition metal.

In another general aspect, a filter includes bulk acoustic wave resonators. At least one of the bulk acoustic wave resonators includes a substrate, a first electrode and a second electrode formed on the substrate, and a piezoelectric layer disposed between the first electrode and the second electrode. Either one or both of the first electrode and the second electrode include a molybdenum-tungsten alloy having a weight ratio of molybdenum to tungsten being in a range of 3:1 to 1:3.

The weight ratio between the molybdenum and the tungsten in the molybdenum-tungsten alloy may be in the range of 3:1 to 1:1.

The molybdenum-tungsten alloy may have a (110) crystal face orientation.

The piezoelectric layer may be formed of aluminum nitride.

The piezoelectric layer may include a rare earth metal or transition metal.

The bulk acoustic wave resonators may be configured in a ladder type structure or a lattice type structure.

The bulk acoustic wave resonator may further include a seed layer formed between the substrate and at least one of the first and second electrodes.

The seek layer may include at least one of Ti and TiW.

In another example, a terminal includes a bulk acoustic wave resonator comprising a piezoelectric layer disposed between a first electrode and a second electrode. The first and second electrodes include a molybdenum-tungsten alloy having a composition that includes 11-80% of tungsten.

The molybdenum-tungsten alloy may have a composition that includes 25-75% of tungsten.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
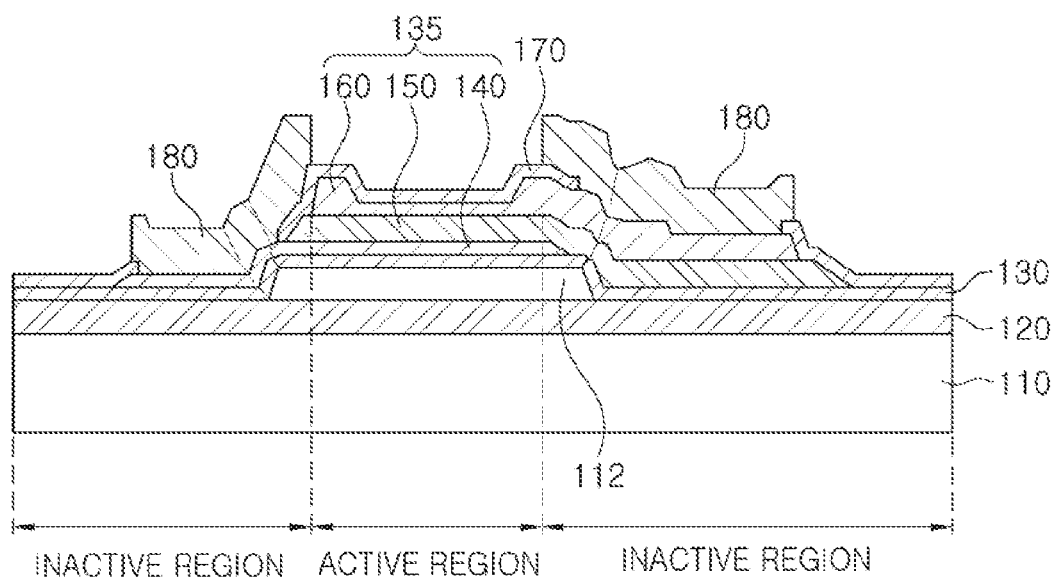
FIG. 1 is a cross-sectional view illustrating an example of a bulk acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

FIG. 1 is a cross-sectional view illustrating an example of a bulk acoustic wave resonator.

Referring to FIG. 1, a bulk acoustic wave resonator is a film bulk acoustic resonator (hereinafter, referred to as an "FBAR"), and includes a substrate 110, an insulating layer 120, an air cavity 112, and a resonant portion 135.

The substrate 110 may be a silicon substrate, and the insulating layer 120 is provided on an upper surface of the substrate 110 to electrically isolate the substrate 110 and the resonant portion 135 from each other. In this case, the insulating layer 120 may be manufactured by forming at least one of silicon dioxide ($SiO_2$), silicon nitride ($Si_3N_4$), aluminum oxide ($Al_2O_3$), or aluminum nitride (AlN) on the substrate 110 by a chemical vapor deposition process, an RF magnetron sputtering process, or an evaporation process.

The air cavity 112 is formed on the substrate 110, and is positioned below the resonant portion 135 so that the resonant portion 135 vibrates in a predetermined direction. The air cavity 112 is formed by forming an air cavity sacrificial layer pattern on the insulating layer 120, forming a membrane 130 on the air cavity sacrificial layer pattern, and then etching and removing the air cavity sacrificial layer pattern by an etching process. In this case, the membrane 130 serves as an oxidation protection film, or may serve as a protection layer, protecting the substrate 110. Although not illustrated in FIG. 1, a seed layer formed of aluminum nitride (AlN) or a metal having a hexagonal closest packing (HCP) structure, particularly, Ti or a Ti alloy, may be formed on the membrane 130. Specifically, the seed layer may be disposed between the membrane 130 and a first electrode 140.

The resonant portion 135 may include the first electrode 140, a piezoelectric layer 150, and a second electrode 160 sequentially stacked to be positioned above the air cavity 112. In this case, the first electrode 140 is formed on an upper surface of the membrane 130 to cover a portion of the membrane 130. The piezoelectric layer 150 is formed on upper surfaces of the membrane 140 and the first electrode 140 to cover a portion of the membrane 130 and a portion of the first electrode 140. The piezoelectric layer 150, which generates a piezoelectric effect in which electric energy is converted into mechanical energy having an elastic waveform, is formed of aluminum nitride (AlN), zinc oxide (ZnO), lead zirconium titanium oxide (PZT; PbZrTiO), or the like, and the second electrode 160 is formed on the piezoelectric layer 150. In addition, in a case in which the piezoelectric layer 150 is formed of the aluminum nitride (AlN), the piezoelectric layer 150 may further include a rare earth metal or transition metal. For example, the rare earth metal may include at least one selected from the group consisting of scandium (Sc), erbium (Er), yttrium (Y), and lanthanum (La), the transition metal may include at least one selected from the group consisting of hafnium (Hf), Titanium (Ti), zirconium (Zr) and magnesium (Mg).

As illustrated in FIG. 1, the resonant portion 135 is divided into an active region and inactive regions. The active region of the resonant portion 135, which is a region vibrating and resonating in a predetermined direction, caused by a piezoelectric phenomenon in which electric energy, such as radio frequency (RF) signals, is applied to the first and second electrodes 140 and 160 to induce an electric field in the piezoelectric layer 150. The active region corresponds to a region in which all of the first electrode 140, the piezoelectric layer 150 and the second electrode 160 above the air cavity 112, overlap one another in a vertical direction. The inactive regions of the resonant portion 135, which are regions that do not resonate as a result of the piezoelectric phenomenon even though electric energy is applied to the first and second electrodes 140 and 160, correspond to regions outside the active region.

The resonant portion 135, configured as described above, filters a wireless signal having a specific frequency using the piezoelectric effect of the piezoelectric layer 150.

In more detail, the resonant portion 135 resonates the piezoelectric layer 150 responsive to the RF signals applied to the first electrode 140 and the second electrode 160, to generate a bulk acoustic wave having a specific resonant frequency and a semi-resonant frequency. A resonance phenomenon of the piezoelectric layer 150 is generated when a half of a wavelength of the applied RF signal coincides with a thickness of the piezoelectric layer 150. Since electrical impedance is rapidly changed at the time of the generation of the resonance phenomenon, the bulk acoustic wave resonator according to the example above, is used as a filter for a particular frequency or frequency range. In further detail, the resonant portion 135 has a predetermined resonant frequency, depending on vibrations generated in the piezoelectric layer 150, such that only a signal having the resonant frequency of the resonant portion 135 among input RF signals is output.

A protection layer 170 is disposed on the second electrode 160 of the resonant portion 135 to prevent the second external electrode 160 from being externally exposed and oxidized. An electrode pad 180 for applying electrical signals is formed on the first electrode 140 and exposed portions of the second electrode 160.

In the present example, at least one of the first electrode 140 or the second electrode 160 may include a molybdenum-tungsten alloy, and a ratio of molybdenum to tungsten in the molybdenum-tungsten alloy is in the range of 3:1 to 1:3. According to the research of the present inventors, when molybdenum-tungsten alloy is used in a ratio of a range of 3:1 to 1:3 as a material of the first and/or the second electrodes 140 and 160, electrical resistance or acoustic impedance characteristics and process efficiency were improved. Here, the ratio between the molybdenum and the tungsten is based on a weight %. In the bulk acoustic resonator, as acoustic impedance of the first and second electrodes 140 and 150 increases, the Kt2 and attenuation characteristics of the resonator can be improved.

In detail, the present inventors have found when molybdenum-tungsten alloy is used as the material of the first and second electrodes 140 and 160, acoustic impedance is improved as compared to a case in which mainly molybdenum is used as the electrode material. The increase in the acoustic impedance described above was understood as an effect of the tungsten. However, in a case in which an amount of tungsten is increased to a predetermined level or higher, a deposition or patterning process became difficult, such that it was difficult to form the electrode structure. In consideration of these factors, the weight ratio between the molybdenum and the tungsten in the molybdenum-tungsten alloy that is appropriate as an electrode material in terms of electrical, acoustic, and process characteristics, and the like, is determined to be in the range of 3:1 to 1:3. In addition, the molybdenum-tungsten alloy has a coefficient of thermal expansion lower than that of pure molybdenum, such that characteristics of a temperature coefficient of frequency (TCF) (a frequency change rate depending on a temperature change) is improved when using the molybdenum-tungsten alloy in the FBAR.

Figure 2:
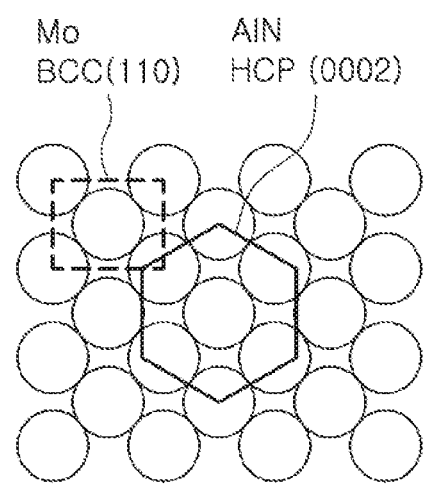
FIG. 2 is a view illustrating the orientation of a (0002) crystal face of aluminum nitride and a (110) crystal face of molybdenum.

Referring to FIG. 2, the crystal orientation of molybdenum (Mo), having a body-centered cubic (BCC) structure, needs to be used as a (110) crystal face in order to orient aluminum nitride (AlN), corresponding to the piezoelectric layer and having a hexagonal close packing (HCP) structure, to a (002) crystal face; lattice mismatch between the aluminum nitride (AlN) and the molybdenum is smallest in this crystal orientation condition. The present inventors manufactured the molybdenum-tungsten alloy by a sputtering method and have confirmed that the molybdenum-tungsten alloy has the same crystal face as that of pure molybdenum. The molybdenum-tungsten alloy has a body-centered cubic (BCC) structure like molybdenum.

Figure 3:
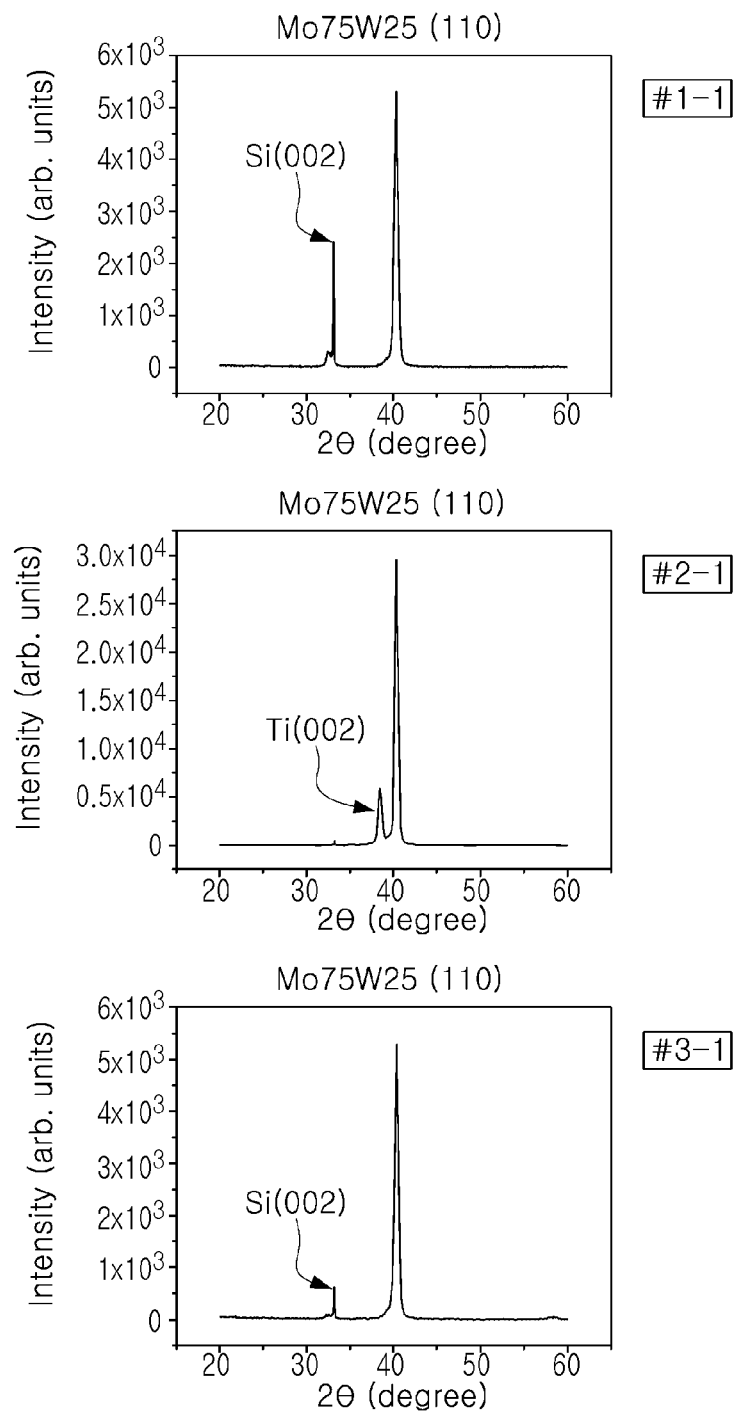
FIGS. 3 and 4 are views illustrating X-ray diffraction spectroscopy (XRD) analysis results for confirming the orientation of a molybdenum-tungsten alloy.
Figure 4:
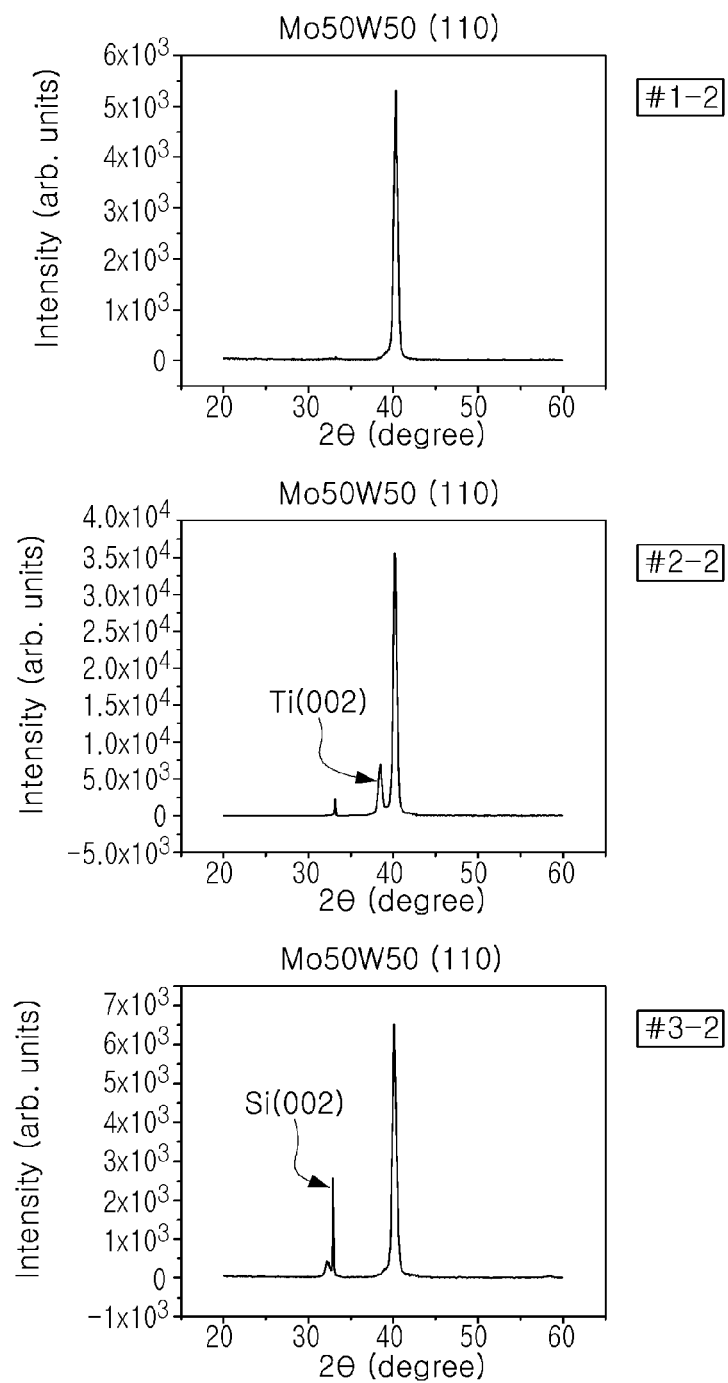

FIGS. 3 and 4 are views illustrating X-ray diffraction spectroscopy (XRD) analysis results for confirming the orientation of a molybdenum-tungsten alloy manufactured by the present inventors. Manufactured samples will be described hereinafter. In FIG. 3, the ratio of molybdenum to tungsten in the molybdenum-tungsten alloy is 75:25, that is, 3:1, and the molybdenum-tungsten alloy was deposited at a thickness of 2000 Å. The deposition condition of each sample is presented in Table 1.

TABLE 1

| Sample No. | Molybdenum:Tungsten | Sheet resistance Ohm/sq | Deposition Condition |
| --- | --- | --- | --- |
| #1-1 | 3:1 | 0.669 | Molybdenum-tungsten alloy was deposited at thickness of 2000 Å on Si wafer |
| #2-1 | 3:1 | 0.623 | Molybdenum-tungsten alloy was deposited at thickness of 2000 Å on Si wafer/Ti seed layer (500 Å) |
| #3-1 | 3:1 | 0.634 | Molybdenum-tungsten alloy was deposited at thickness of 2000 Å on Si wafer/TiW seed layer (500 Å) |

In FIG. 4, the ratio of molybdenum to tungsten in the molybdenum-tungsten alloy is 50:50, that is, 1:1, and the molybdenum-tungsten alloy was deposited at a thickness of 2000 Å. The deposition condition of each of these samples is presented by Table 2.

TABLE 2

| Sample No. | Molybdenum:Tungsten | Sheet resistance Ohm/sq | Deposition Condition |
|---|---|---|---|
| #1-2 | 1:1 | 0.81 | Molybdenum-tungsten alloy was deposited at thickness of 2000 Å on Si wafer |
| #2-2 | 1:1 | 0.78 | Molybdenum-tungsten alloy was deposited at thickness of 2000 Å on Si wafer/Ti seed layer (500 Å) |
| #3-2 | 1:1 | 0.789 | Molybdenum-tungsten alloy was deposited at thickness of 2000 Å on Si wafer/TiW seed layer (500 Å) |

Referring to the XRD analysis results of FIGS. 3 and 4, the results confirm that the molybdenum-tungsten alloys have similar orientations to a (110) crystal face, with little difference in orientation found when testing different compositions thereof. In addition, the present inventors analyzed surface morphologies of the molybdenum-tungsten alloys manufactured by the process described above, and a secondary phase due to non-uniformity of the composition was not observed on surfaces of the molybdenum-tungsten alloys after being deposited, while varying the ratios in the range of 3:1 to 1:1 did not cause a large difference in the results.

Moreover, referring to the Tables 1 and 2, the samples (#2-1, #3-1, #2-2, #3-2) in which the molybdenum-tungsten alloy is deposited on Ti or TiW seed layers show improvement in terms of sheet resistance property. In other words, the samples (#2-1, #3-1, #2-2, #3-2) with Ti or TiW seed layers have sheet resistances lower than those of another samples (#1-1, #1-2) without seed layers.

Figure 5:
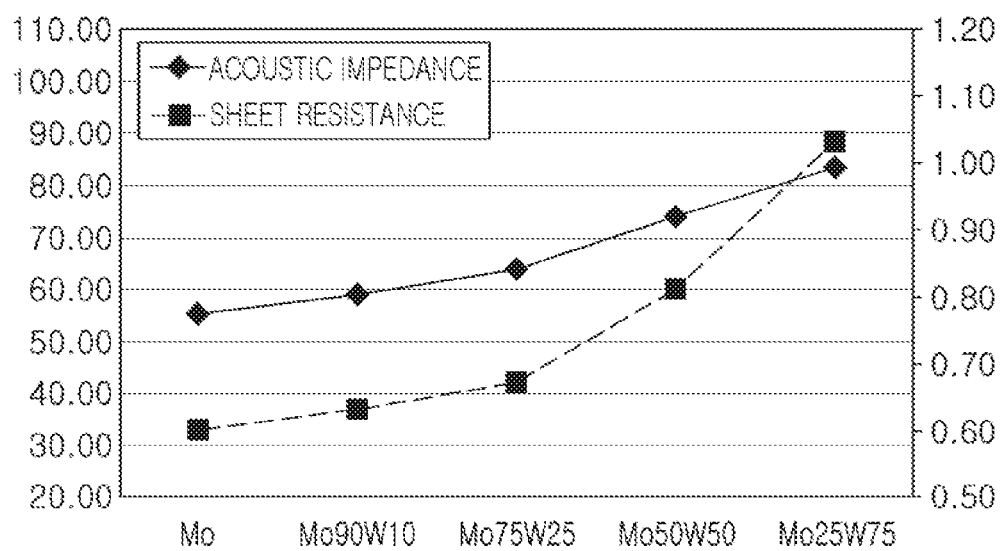
FIG. 5 is a graph illustrating changes in electrical characteristics and acoustic impedance characteristics depending on a ratio of molybdenum to tungsten.

FIG. 5 is a graph illustrating changes in electrical characteristics and acoustic impedance characteristics depending on the ratio of molybdenum to tungsten. Electrical characteristics of sheet resistance of manufactured molybdenum-tungsten alloy samples were measured. In the graph of FIG. 5, the left vertical axis indicates acoustic impedance (unit: $kg/m^2/s$), and the right vertical axis indicates sheet resistance (unit: ohm/sq).

Figure 6:
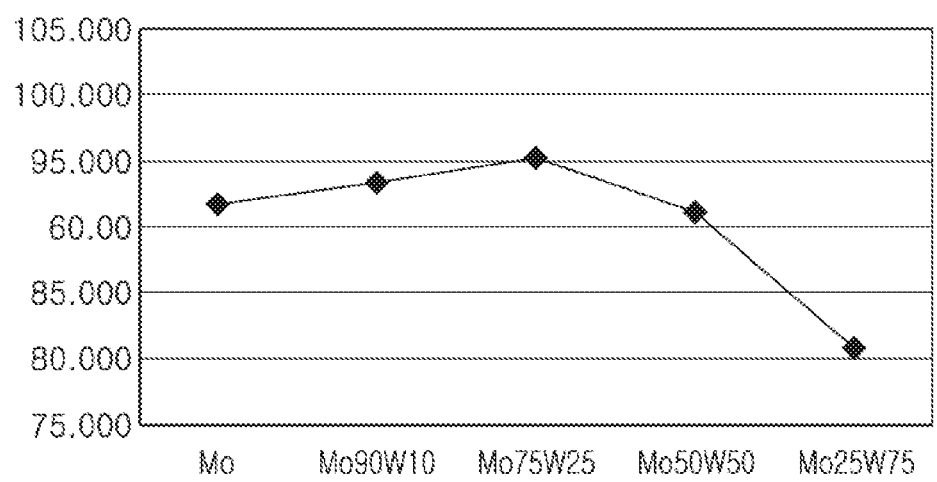
FIG. 6 is a graph illustrating acoustic impedance/sheet resistance values calculated depending on a ratio of molybdenum to tungsten.
Figure 7:
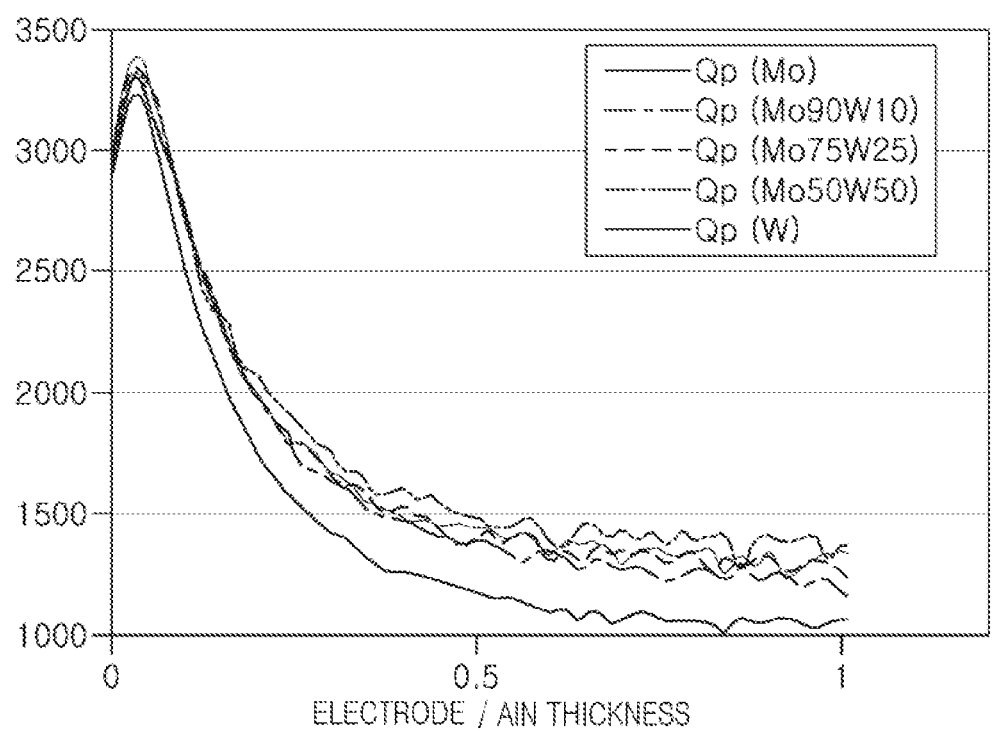
FIG. 7 is a graph illustrating changes of a Qp characteristic according to a ratio of molybdenum to tungsten.

FIG. 6 is a graph illustrating acoustic impedance/sheet resistance values calculated depending on a ratio of molybdenum to tungsten. Moreover, FIG. 7 is a graph illustrating changes of a Qp feature according to a ratio of molybdenum to tungsten.

First, when confirming an appropriate ratio of molybdenum to tungsten in a molybdenum-tungsten alloy by analyzing the graphs of FIGS. 5 and 6, resonant characteristics that depends on increasing acoustic impedance were better than the influence due to an increase in sheet resistance in a range of 3:1 to 1:3 of the weight ratio between the molybdenum and the tungsten. The molybdenum-tungsten alloy, in which the weight ratio of molybdenum to tungsten is in the range of 3:1 to 1:3, corresponds to an electrode material that is appropriate for use in the FBAR. While acoustic impedance of electrodes significantly affects the Qp characteristics of the resonator, a molybdenum-tungsten alloy in a range of 3:1 to 1:3 of the weight ratio between the molybdenum and the tungsten has higher acoustic impedance than that of a pure molybdenum, and this can lead to an improvement of Kt2 characteristic of the resonator.

However, when the weight ratio of molybdenum to tungsten exceeds 3:1 by increasing the amount of tungsten, since the influence of growth of sheet resistance, rather than growth of acoustic impedance, gets increased, acoustic impedance/sheet resistance values were reduced. When the ratio of molybdenum to tungsten approaches to 1:3, acoustic impedance/sheet resistance values reduced. It was confirmed during testing that when the ratio of molybdenum to tungsten is larger than 1:3, by further increasing an amount of the tungsten in the ratio, thereby the inclination of growth of sheet resistance significantly increases, problems due to an increase in sheet resistance is greater than that of an improvement of performance due to an increase in acoustic impedance. According to these results, it is confirmed that a preferable range of a weight ratio of the alloy is 3:1 to 1:3. Moreover, according to the changes of a Qp characteristic of FIG. 7, the alloy having a ratio of 1:1 has the best Qp characteristic, and the alloy having a ratio of 3:1 has a similar characteristic as that of a pure tungsten. From these results, it is confirmed that a more preferable range of the ratio between the molybdenum and the tungsten is 3:1 to 1:1.

Figure 8:
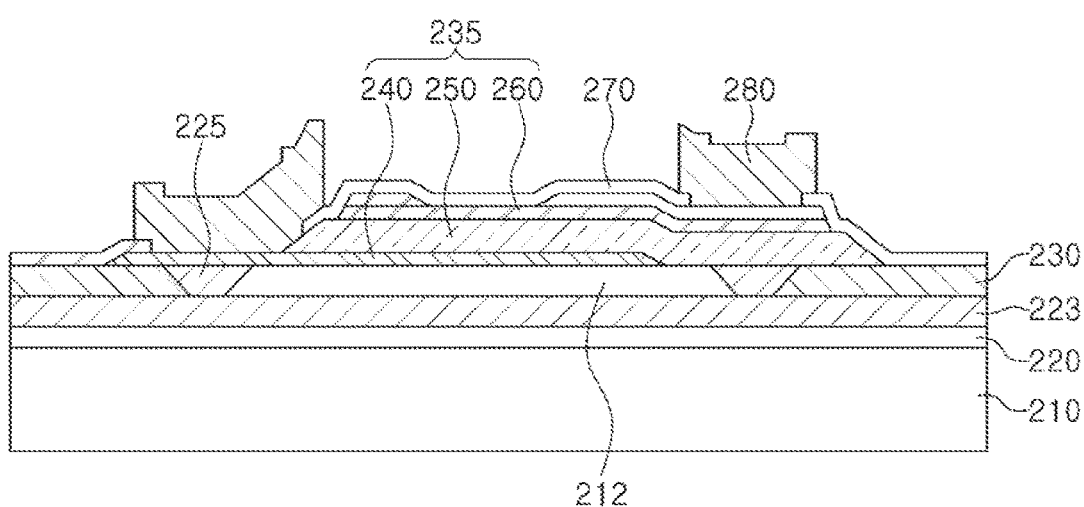
FIG. 8 is a cross-sectional view illustrating another example of a bulk acoustic wave resonator.

FIG. 8 is a cross-sectional view illustrating another example of a bulk acoustic wave resonator. The bulk acoustic wave resonator is different from the bulk acoustic wave resonator illustrated in FIG. 1 due to the inclusion of an air cavity 212. The bulk acoustic wave resonator of FIG. 8 includes a substrate 210, an insulating layer 220, an etch stop layer 223, an etch stop portion 225, an air cavity 212, a sacrificial layer pattern 230, and a resonant portion 235. The resonant portion 235 includes a first electrode 240, a piezoelectric layer 250, and a second electrode 260, and may further include a protection layer 270 and an electrode pad 280.

In the following discussion, components different from the components of the bulk acoustic wave resonator in FIG. 1 will principally be described. The etch stop layer 223 is formed on the insulating layer 220, and serves to protect the substrate 210, and the insulating layer 220 when performing an etching process. The etch stop portion 225, the air cavity 212, and the sacrificial layer pattern 230 are formed on the etch stop layer 223. In this case, the etch stop portion 225, the air cavity 212, and the sacrificial layer pattern 230 are formed at substantially the same height, such that one surface of the etch stop portion 225, the air cavity 212, and the sacrificial layer pattern 230 are substantially coplanar.

The air cavity 212 is positioned below the resonant portion 235 that includes the first electrode 240, the piezoelectric layer 250, and the second electrode 260, so that the resonant portion 235 vibrates in a predetermined direction. The air cavity 212 may be formed by forming a sacrificial layer on the etch stop layer 223, stacking the first electrode 240, the piezoelectric layer 250, and the second electrode 260 on the sacrificial layer, and then removing the sacrificial layer through an etching process.

The etch stop portion 225 is formed on an outer side of the air cavity 212. The etch stop portion 225 may have a shape in which it protrudes onto the etch stop layer 223, such that an outer peripheral boundary surface of the air cavity 212 is defined by a side surface of the etch stop portion 225. In the present example, the shape of a cross section of the etch stop portion 225 is substantially trapezoidal. In detail, a width of an upper surface of the etch stop portion 225 is wider than that of a lower surface thereof, and side surfaces of the etch stop portion 225 connecting the upper surface and the lower surface to each other are inclined. The etch stop layer 223 and the etch stop portion 225 may be formed of a material that is removed in an etching process for removing the sacrificial layer. As an example, the etch stop layer 223 and the etch stop portion 225 are formed of the same material. A shape of the air cavity 212 after the sacrificial layer is removed may be defined by a space surrounded by the etching stop layer 223 and the etch stop portion 225. In detail, a lower boundary surface of the air cavity 212 is defined by the etch stop layer 223, and the outer peripheral boundary surface of the air cavity 212 is defined by the etch stop portion 225.

The sacrificial layer pattern 230 is formed on an outer side of the etch stop portion 225, that is, on the other side of the air cavity 212, in relation to the etch stop portion 225. The sacrificial layer pattern 230 is extended to the outer side of the etch stop portion 225. The sacrificial layer pattern 230 corresponds to a remaining portion after an etching process of the sacrificial layer is formed on the etch stop layer 223.

The first electrode 240, the piezoelectric layer 250, and the second electrode 260 form the resonant portion 235. A common region in which the first electrode 240, the piezoelectric layer 250, and the second electrode 260 overlap each other in the vertical direction is positioned above the air cavity 212. Like the example described above, the piezoelectric layer 250, which generates a piezoelectric effect in which electric energy is converted into mechanical energy having an elastic waveform, is formed of aluminum nitride (AlN), zinc oxide (ZnO), or lead zirconium titanium oxide (PZT; PbZrTiO), and the second electrode 260 is formed on the piezoelectric layer 250. In addition, when the piezoelectric layer 250 is formed of the aluminum nitride (AlN), the piezoelectric layer 250 may further include a rare earth metal or transition metal. For example, the rare earth metal may include at least one selected from the group consisting of scandium (Sc), erbium (Er), yttrium (Y), and lanthanum (La).

As is also seen in the present example, at least one of the first electrode 240 or the second electrode 260 may include a molybdenum-tungsten alloy, and a ratio of molybdenum to tungsten in the molybdenum-tungsten alloy is in the range of 3:1 to 1:3.

Figure 9:
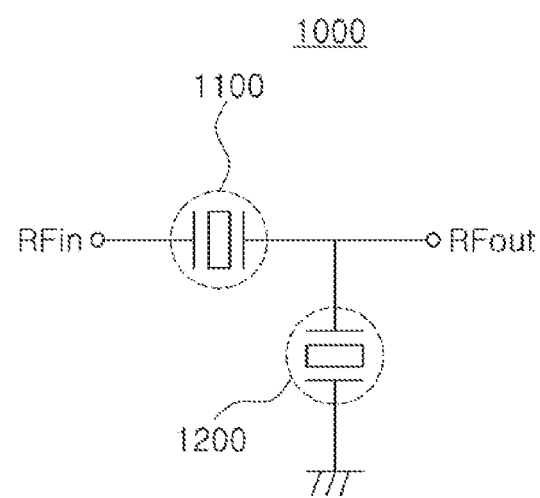
FIGS. 9 and 10 are schematic circuit diagrams of examples of filters.
Figure 10:
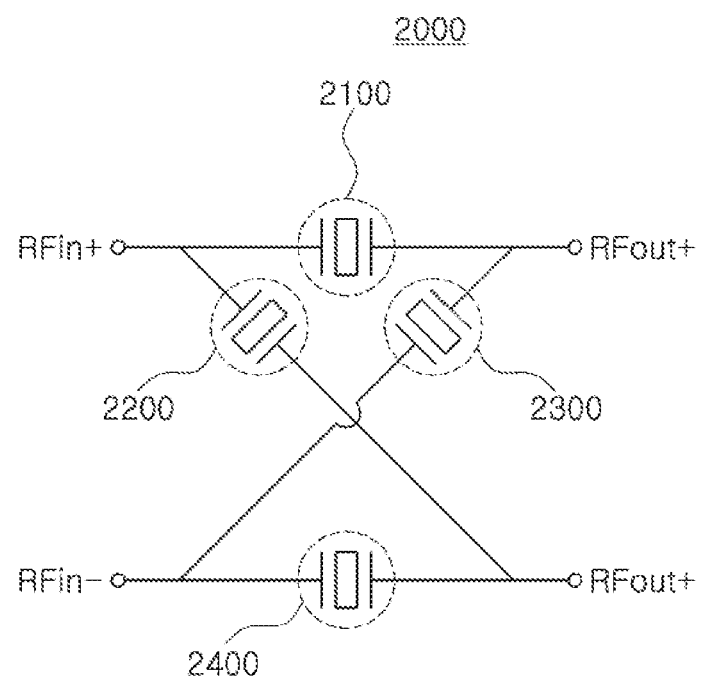

FIGS. 9 and 10 are schematic circuit diagrams of filters according to examples in the present disclosure. Each of the bulk acoustic wave resonators used in the filters of FIGS. 8 and 9 may be the same as the bulk acoustic wave resonator illustrated in FIG. 1.

Referring to FIG. 9, a filter 1000, according to an example in the present disclosure is formed in a ladder type filter structure. In detail, the filter 1000 includes a plurality of bulk acoustic wave resonators 1100 and 1200. The first bulk acoustic wave resonator 1100 is connected between a signal input terminal, to which an input signal RFin is input, and a signal output terminal, from which an output signal RFout is output, in series. The second first bulk acoustic wave resonator 1120 is connected between the signal output terminal and a ground.

Referring to FIG. 10, a filter 2000, according to another example in the present disclosure, is formed in a lattice type filter structure. In detail, the filter 200 includes a plurality of bulk acoustic wave resonators 2100, 2200, 2300, and 2400, and filters balanced input signals RFin+ and RFin− and balanced output signals RFout+ and RFout−.

As set forth above, in the bulk acoustic wave resonator according to the examples in the present disclosure, electrical resistance and acoustic impedance characteristics and process efficiency are improved.

As a non-exhaustive example only, a terminal/device/unit as described herein may be a mobile device, such as a cellular phone, a smart phone, a wearable smart device (such as a ring, a watch, a pair of glasses, a bracelet, an ankle bracelet, a belt, a necklace, an earring, a headband, a helmet, or a device embedded in clothing), a portable personal computer (PC) (such as a laptop, a notebook, a subnotebook, a netbook, or an ultra-mobile PC (UMPC), a tablet PC (tablet), a phablet, a personal digital assistant (PDA), a digital camera, a portable game console, an MP3 player, a portable/personal multimedia player (PMP), a handheld e-book, a global positioning system (GPS) navigation device, or a sensor, or a stationary device, such as a desktop PC, a high-definition television (HDTV), a DVD player, a Blu-ray player, a set-top box, or a home appliance, or any other mobile or stationary device configured to perform wireless or network communication. In one example, a wearable device is a device that is designed to be mountable directly on the body of the user, such as a pair of glasses or a bracelet. In another example, a wearable device is any device that is mounted on the body of the user using an attaching device, such as a smart phone or a tablet attached to the arm of a user using an armband, or hung around the neck of the user using a lanyard.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk acoustic wave resonator comprising:
   a substrate;
   a first electrode and a second electrode formed on the substrate;
   a seed layer formed between the substrate and at least one of the first and second electrodes, wherein the seed layer has a hexagonal close packing (HCP) structure, and comprises TiW; and
   a piezoelectric layer disposed between the first electrode and the second electrode,
   wherein either one or both of the first electrode and the second electrode comprise a molybdenum-tungsten alloy having a weight ratio of molybdenum to tungsten in a range of 3:1 to 1:3.

2. The bulk acoustic wave resonator of claim 1, wherein the piezoelectric layer is formed of aluminum nitride.

3. The bulk acoustic wave resonator of claim 2, wherein the piezoelectric layer includes a rare earth metal or transition metal.

4. The bulk acoustic wave resonator of claim 1, wherein the weight ratio between the molybdenum and the tungsten in the molybdenum-tungsten alloy is in the range of 3:1 to 1:1.

5. The bulk acoustic wave resonator of claim 1, wherein the molybdenum-tungsten alloy has a 110 crystal face orientation.

6. The bulk acoustic wave resonator of claim 1, wherein the seed layer is formed between the substrate and the first electrode.

7. A filter comprising:
bulk acoustic wave resonators, at least one of the bulk acoustic wave resonators comprising:
a substrate;
a first electrode and a second electrode formed on the substrate;
a seed layer formed between the substrate and at least one of the first and second electrodes, wherein the seed layer has a hexagonal close packing (HCP) structure, and comprises TiW; and
a piezoelectric layer disposed between the first electrode and the second electrode,
wherein either one or both of the first electrode and the second electrode comprise a molybdenum-tungsten alloy having a weight ratio of molybdenum to tungsten in a range of 3:1 to 1:3.

8. The filter of claim 7, wherein the piezoelectric layer is formed of aluminum nitride.

9. The filter of claim 8, wherein the piezoelectric layer includes a rare earth metal or transition metal.

10. The filter of claim 7, wherein the weight ratio between the molybdenum and the tungsten in the molybdenum-tungsten alloy is in the range of 3:1 to 1:1.

11. The filter of claim 7, wherein the molybdenum-tungsten alloy has a 110 crystal face orientation.

12. The filter of claim 7, wherein the bulk acoustic wave resonators are configured in a ladder type structure or a lattice type structure.

13. The filter of claim 7, wherein the seed layer formed between the substrate and the first electrode.

14. A terminal, comprising:
a bulk acoustic wave resonator comprising a piezoelectric layer disposed between a first electrode and a second electrode, the first and second electrodes comprising a molybdenum-tungsten alloy having a composition that comprises 11-80 percent by weight (wt %) of tungsten; and
a seed layer formed between the substrate and at least one of the first and second electrodes, wherein the seed layer has a hexagonal close packing (HCP) structure, and comprises TiW.

15. The terminal of claim 14, wherein the molybdenum-tungsten alloy has a composition that comprises 25-75 wt % of tungsten.

* * * * *